US012359994B2

(12) United States Patent
Bieselt et al.

(10) Patent No.: US 12,359,994 B2
(45) Date of Patent: Jul. 15, 2025

(54) SEMICONDUCTOR DIE WITH PRESSURE AND ACCELERATION SENSOR ELEMENTS

(71) Applicant: Infineon Technologies Dresden GMBH & Co. KG, Dresden (DE)

(72) Inventors: Steffen Bieselt, Wehlen (DE); Dirk Meinhold, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 487 days.

(21) Appl. No.: 17/445,859

(22) Filed: Aug. 25, 2021

(65) Prior Publication Data

US 2022/0074803 A1   Mar. 10, 2022

(30) Foreign Application Priority Data

Sep. 4, 2020   (DE) .......................... 102020123160.1

(51) Int. Cl.
*G01L 9/00*   (2006.01)
(52) U.S. Cl.
CPC .......... *G01L 9/0054* (2013.01); *G01L 9/0045* (2013.01); *G01L 9/0073* (2013.01)
(58) Field of Classification Search
CPC .... B81B 2201/0235; B81B 2201/0264; B81B 7/02; G01L 9/06; G01L 9/0092; G01P 15/18; G01P 15/0802; G01P 15/125; B81C 1/00015
USPC ........................................................ 257/415
See application file for complete search history.

(56) References Cited

U.S. PATENT DOCUMENTS

| 7,972,888 | B1 | 7/2011 | Li et al. |
| 9,550,668 | B1* | 1/2017 | Xia ........................... B81B 7/02 |
| RE46,671 | E * | 1/2018 | Combi ...................... B81B 7/02 |
| 2002/0194919 | A1* | 12/2002 | Lee ........................ G01L 9/0042 |
| | | | 73/718 |
| 2004/0080004 | A1* | 4/2004 | Benzel ................ B81C 1/00182 |
| | | | 257/414 |
| 2005/0208696 | A1* | 9/2005 | Villa ...................... G01L 9/0045 |
| | | | 438/53 |
| 2006/0272413 | A1* | 12/2006 | Vaganov ................. G01P 15/18 |
| | | | 73/514.01 |

(Continued)

FOREIGN PATENT DOCUMENTS

| CN | 103712720 A | 4/2014 |
| CN | 105776122 A | 7/2016 |

(Continued)

*Primary Examiner* — Eva Y Montalvo
*Assistant Examiner* — Nicholas B Michaud
(74) *Attorney, Agent, or Firm* — Harrity & Harrity, LLP

(57) ABSTRACT

In some implementations a semiconductor die comprises a semiconductor chip. The semiconductor chip comprises a piezoresistive pressure sensor element and at least one capacitive acceleration sensor element. The piezoresistive pressure sensor element is arranged to the side of the capacitive acceleration sensor element. In some implementations, a method for producing a semiconductor die includes applying an insulation layer to the semiconductor wafer. A section of the monocrystalline cover layer may be exposed by structuring the insulation layer. A semiconductor layer having a monocrystalline section and a polycrystalline section may be generated by deposition of a semiconductor material.

22 Claims, 12 Drawing Sheets

(56) References Cited

U.S. PATENT DOCUMENTS

| | | | |
|---|---|---|---|
| 2007/0290364 A1* | 12/2007 | Gupta | B81C 1/00333 |
| | | | 257/777 |
| 2009/0229370 A1 | 9/2009 | Fujii et al. | |
| 2010/0242603 A1 | 9/2010 | Miller et al. | |
| 2011/0126632 A1* | 6/2011 | McNeil | B81B 7/02 |
| | | | 73/718 |
| 2012/0299127 A1* | 11/2012 | Fujii | G01L 9/0085 |
| | | | 257/415 |
| 2013/0283912 A1* | 10/2013 | Lin | G01L 13/025 |
| | | | 73/717 |
| 2015/0035093 A1 | 2/2015 | Feyh et al. | |
| 2015/0096376 A1 | 4/2015 | Feyh et al. | |
| 2015/0274512 A1* | 10/2015 | Xu | B81B 7/0074 |
| | | | 438/51 |
| 2016/0137491 A1* | 5/2016 | Su | B81B 7/02 |
| | | | 438/51 |
| 2016/0167953 A1 | 6/2016 | Gogoi | |
| 2017/0305738 A1* | 10/2017 | Chang | B81B 3/001 |
| 2017/0328800 A1* | 11/2017 | Li | G01L 9/0042 |
| 2018/0231423 A1* | 8/2018 | Shih | G01P 15/123 |
| 2019/0202685 A1* | 7/2019 | Wang | B81B 7/007 |
| 2020/0180947 A1* | 6/2020 | Classen | B81B 7/04 |

FOREIGN PATENT DOCUMENTS

| | | |
|---|---|---|
| CN | 107265388 A | 10/2017 |
| CN | 107381496 A | 11/2017 |
| DE | 10017976 A1 | 10/2001 |

\* cited by examiner

SEMICONDUCTOR DIE WITH PRESSURE AND ACCELERATION SENSOR ELEMENTS

CROSS REFERENCE TO RELATED APPLICATION

This application claims priority to German Patent Application No. 102020123160.1 filed on Sep. 4, 2020, the content of which is incorporated by reference herein in its entirety.

TECHNICAL FIELD

Aspects of the present disclosure generally relate to a sensor and a semiconductor die for producing a sensor.

BACKGROUND

Modern sensors are increasingly manufactured based on semiconductor dies. Using established semiconductor processing techniques, many functional units are produced together by processing a semiconductor wafer, wherein the processed semiconductor wafer is then divided into a plurality of semiconductor dies that form the basis for the individual sensors.

BRIEF DESCRIPTION OF THE DRAWINGS

The proposed semiconductor die and the proposed method are now explained in more detail by reference to the drawing. In the drawings.

DETAILED DESCRIPTION

Often, sensors are required to measure accelerations and pressures simultaneously.

There is therefore a need for sensors that comprise both a pressure sensor element and an acceleration sensor element, which are characterized by improved manufacturability.

Some implementations described herein relate to a semiconductor die that includes both a pressure sensor element and an acceleration sensor element and a method for producing the semiconductor die.

In some implementations, a semiconductor die comprises a semiconductor chip. The semiconductor chip comprises a piezoresistive pressure sensor element and at least one capacitive acceleration sensor element. The piezoresistive pressure sensor element is arranged to the side of the capacitive acceleration sensor element.

In some implementations, a method for producing a semiconductor die includes applying an insulation layer to the semiconductor wafer, wherein a section of the monocrystalline cover layer is exposed by structuring the insulation layer, wherein a semiconductor layer is generated by deposition of a semiconductor material, and wherein the semiconductor layer has a monocrystalline section and a polycrystalline section.

Figure 1:
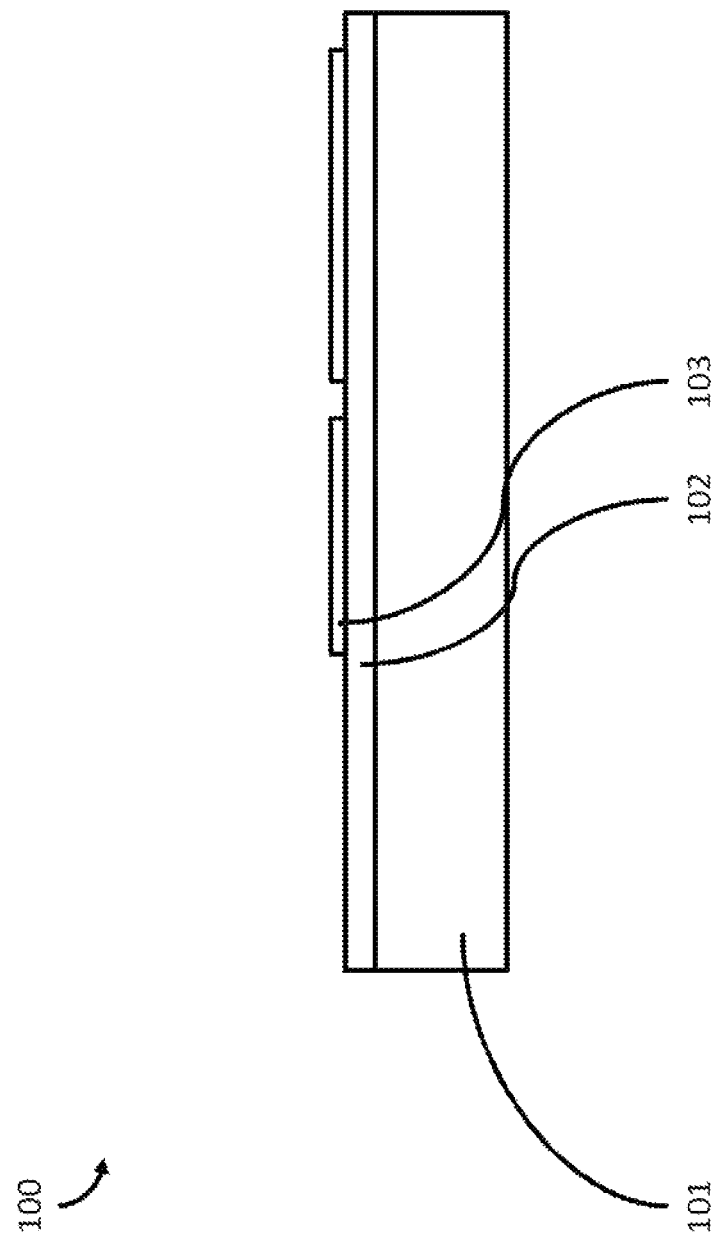
FIG. 1 shows a wafer.

The wafer 100 shown in FIG. 1 comprises a substrate 101 which has a monocrystalline cover layer. The substrate 101 can be a silicon substrate, for example. An insulation layer 102 is applied to the substrate 101. The insulation layer 102 can be an insulation oxide layer, in particular a silicon oxide layer. A sensor surface 103 is applied to the insulation layer 102. The sensor surface can be a sensor surface 103 made of polysilicon. In some implementations, another material may be used to produce the sensor surface 103.

Figure 2:
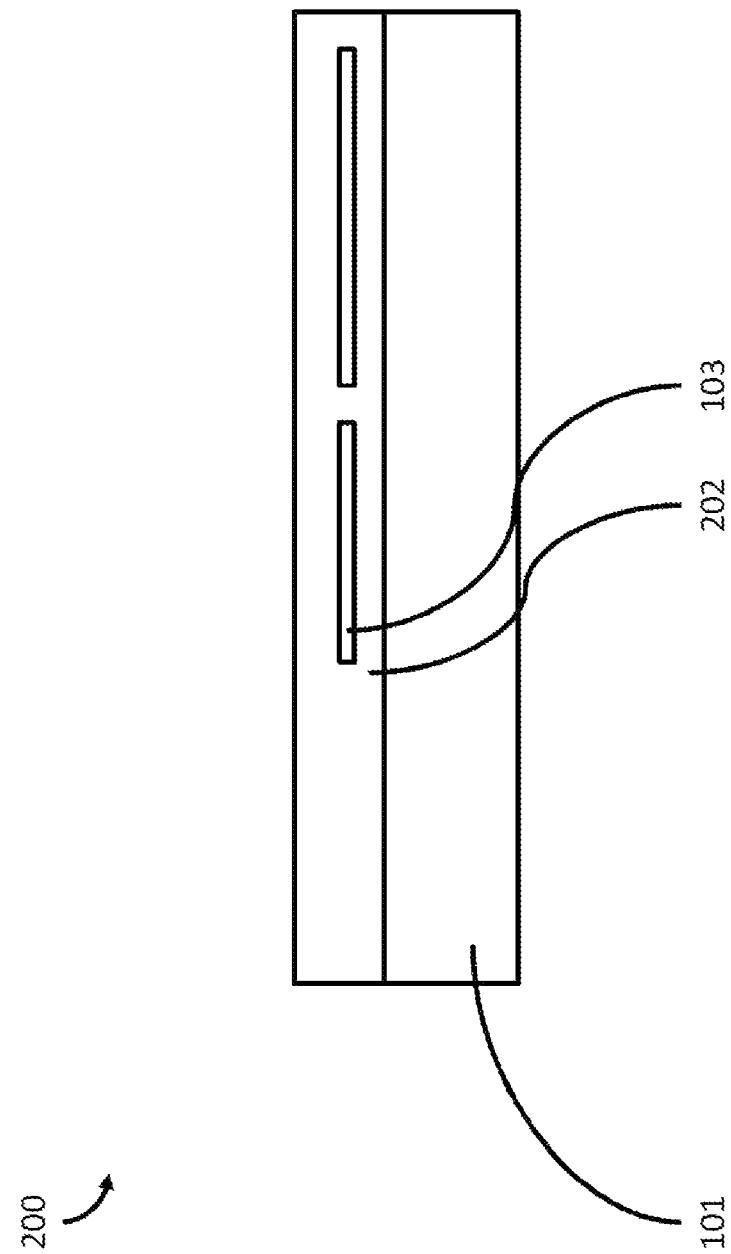
FIG. 2 shows the wafer from FIG. 1 after processing.
Figure 3:
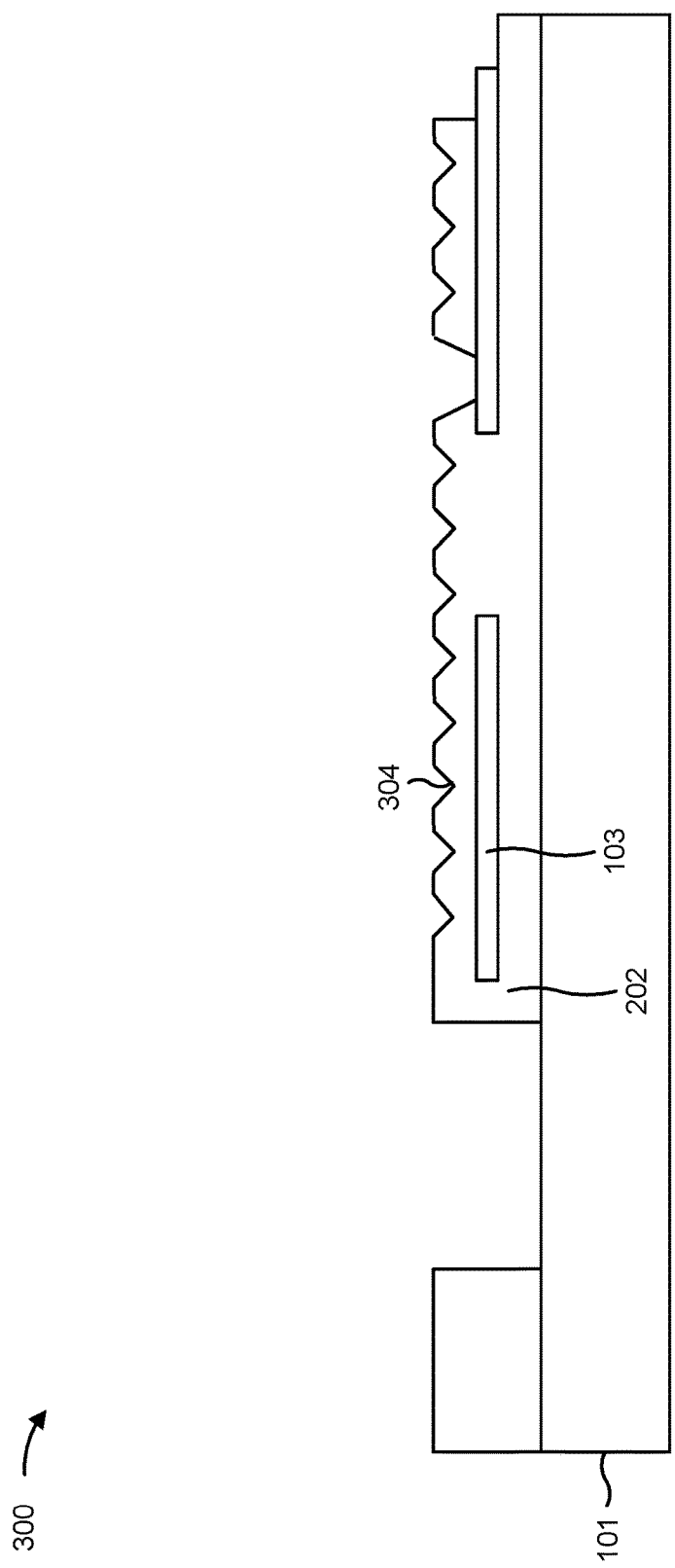
FIG. 3 shows the wafer from FIG. 2 after processing.

FIG. 2 shows a wafer 200 after the wafer 100 has been processed further. In some implementations, additional insulation material has been applied to the insulation layer 102 so that the insulation layer 102 also covers the sensor surfaces 103. In FIG. 3, the insulation layer 202 is shown as a single insulation layer 202. In some implementations, a different material is used after applying the insulation layer 102 so that the insulation layer 202 includes two sub-layers.

FIG. 3 shows a wafer 300 which has resulted from further processing of the wafer 200. As shown in FIG. 3, the insulation layer 202 has been structured. A section of the substrate with the monocrystalline cover layer has been exposed. In the course of the structuring, recesses 304 have been introduced into the insulation layer 202.

Figure 4:
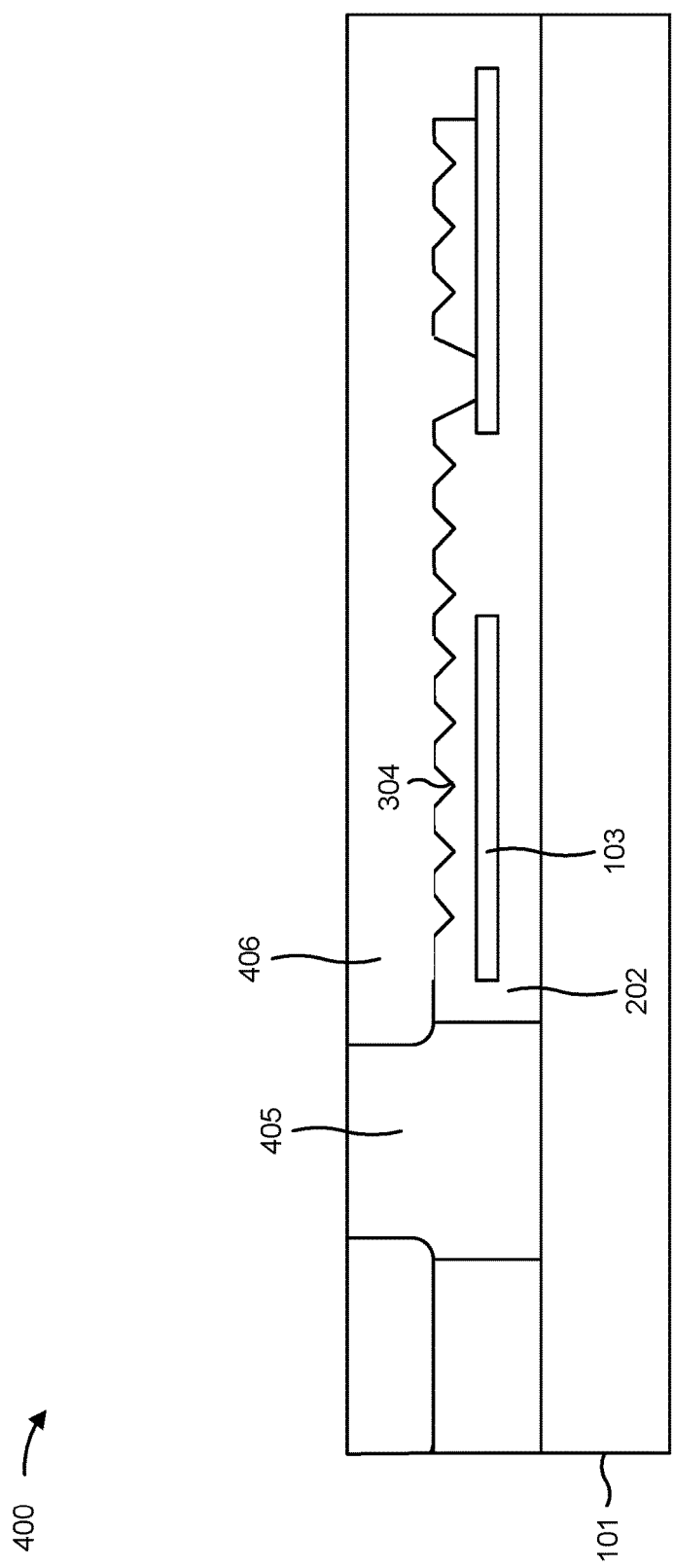
FIG. 4 shows the wafer from FIG. 3 after processing.

After structuring the insulation layer 202, a semiconductor layer 405, 406, as shown in FIG. 4, is produced by deposition of a semiconductor material. The semiconductor layer comprises a monocrystalline section 405 and a polycrystalline section 406. In some implementations, the deposition process can be chosen in such a way that in the monocrystalline section 405, the semiconductor layer grows epitaxially starting from the monocrystalline cover layer exposed during the structuring of the insulation layer and the deposition on the insulation layer 202 gives rise to polycrystalline growth. In some implementations, to produce the semiconductor layer, a silicon can be deposited.

Directly after the deposition of the semiconductor material, the cover surface of the wafer 400 can be leveled. This can be achieved, for example, using chemical mechanical polishing (CMP). The thickness of the deposited semiconductor layer may be more than 10 µm. In some implementations, the thickness of the deposited semiconductor layer may be more than 15 µm. In some implementations, the thickness of the semiconductor layer is less than 35 µm. In some implementations, the thickness of the semiconductor layer is less than 25 µm. For example, the thickness of the semiconductor layer 405, 406 can be approximately 20 µm.

Figure 5:
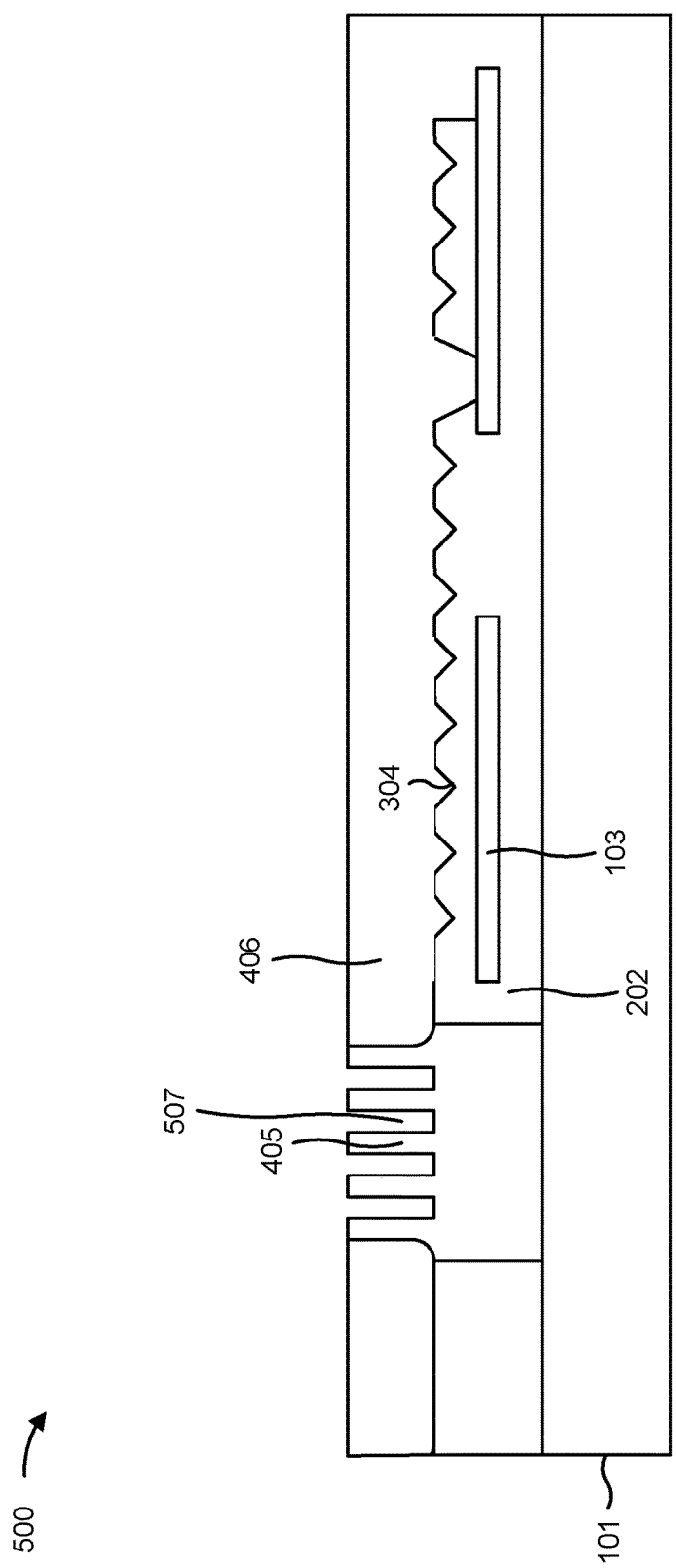
FIG. 5 shows the wafer from FIG. 4 after processing.

FIG. 5 shows the semiconductor wafer 500 that is obtained after trenches 507 have been introduced into the semiconductor wafer 400 to produce a buried cavity.

Figure 6:
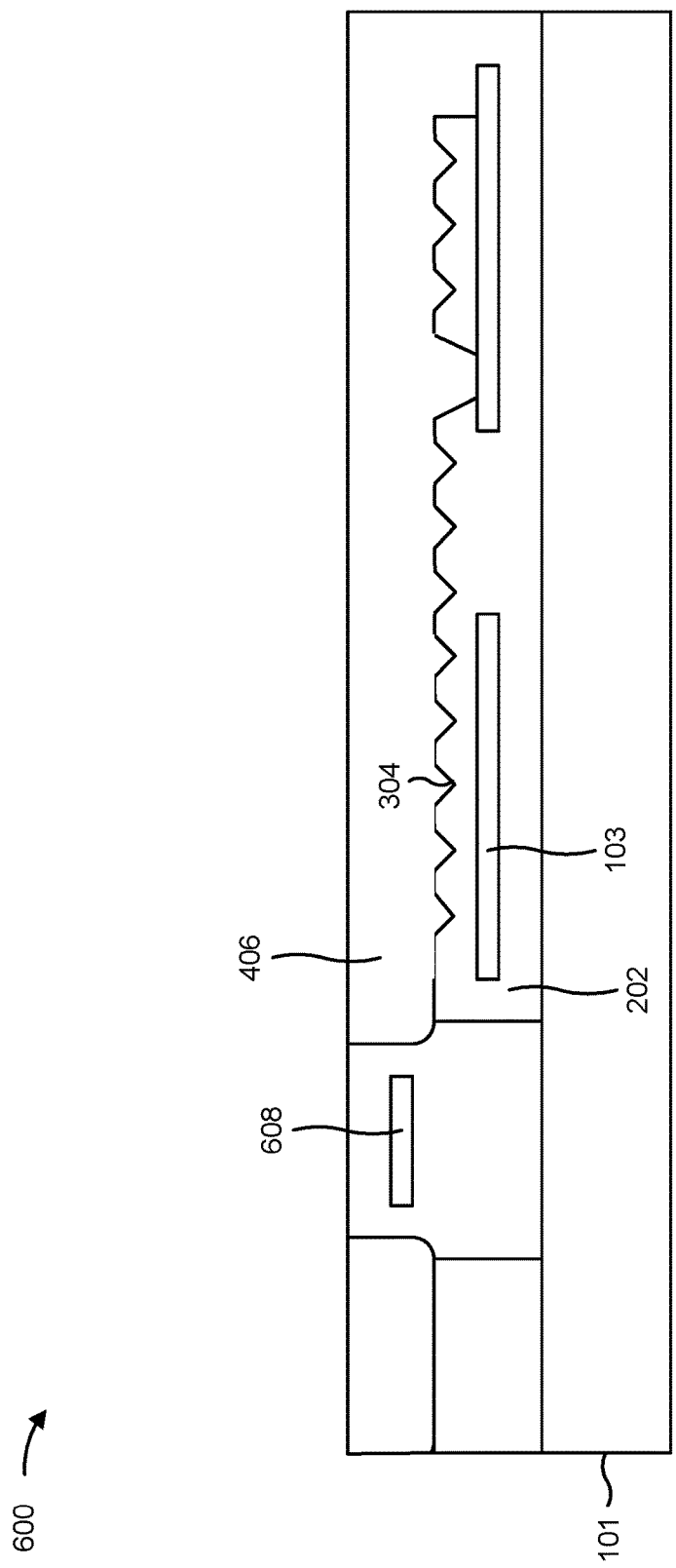
FIG. 6 shows the wafer from FIG. 5 after processing.

After tempering the wafer in a hydrogen atmosphere (H2 annealing), the wafer 600 shown in FIG. 6 with a buried cavity 608 is obtained. The method of obtaining buried cavities 608 by producing deep trenches 507 and subsequent tempering is also called the Venezia process.

Figure 7:
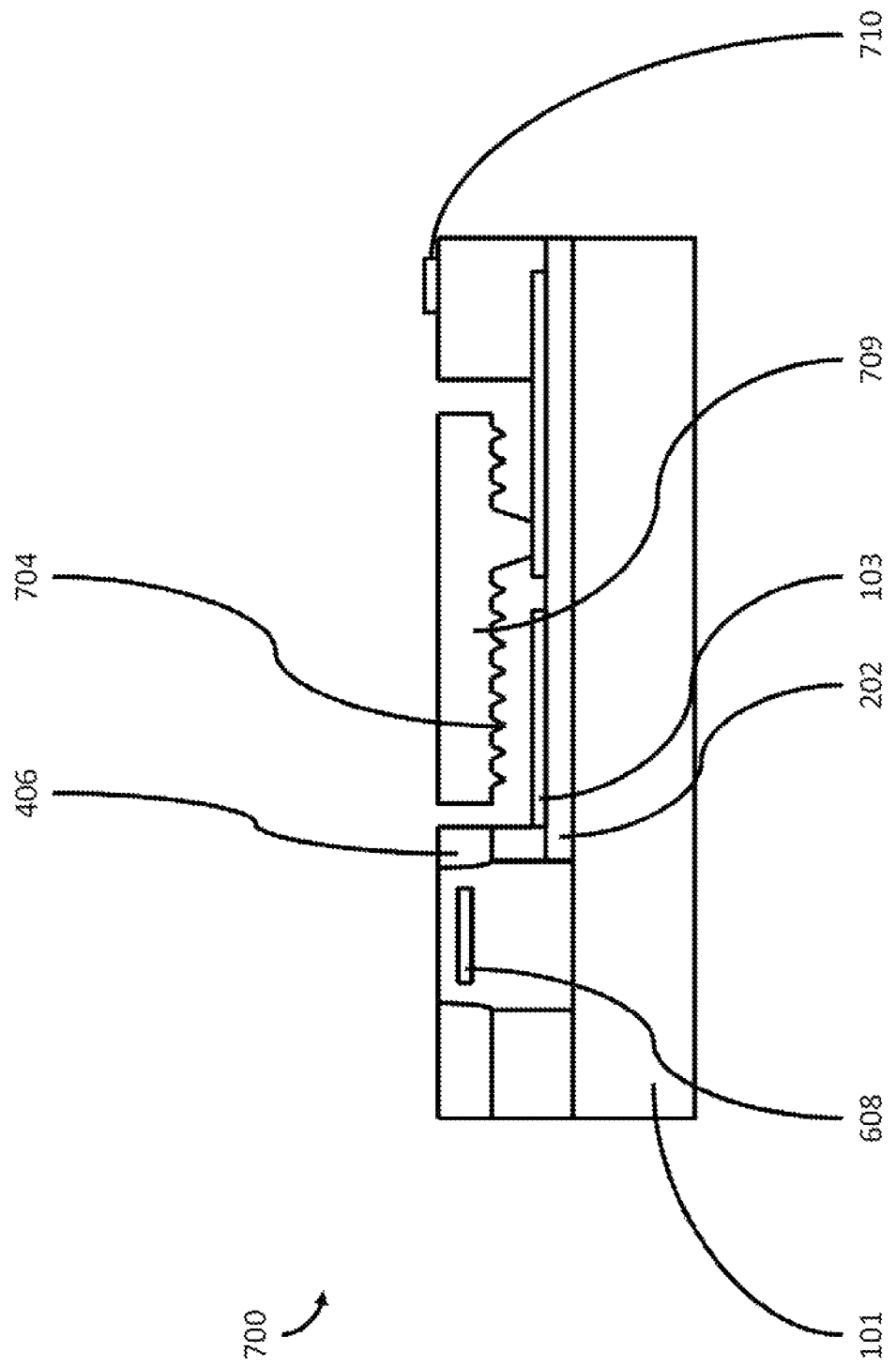
FIG. 7 shows the wafer from FIG. 6 after processing.

FIG. 7 shows the wafer 700 after the acceleration mass 709 of the acceleration sensor element has been exposed by structuring the polycrystalline section and subsequent removal by etching. The recesses give rise to projections 704, which prevent the acceleration mass 709 from adhering to the sensor surfaces 103 during the motion of the acceleration mass 709. A contacting surface 710 is also shown, via which an electrical connection to the acceleration sensor element can be produced. The pressure within the buried cavity 608 corresponds to the pressure at which the wafer 500 was tempered. In some implementations, the pressure at which the wafer 500 is tempered is less than 100 mbar. In some implementations, the pressure at which the wafer 500 was tempered is less than 20 mbar. For example, the pressure inside the buried cavity can be 13 mbar.

After the buried cavity 608 has been produced, the membrane formed above the cavity 608 can be implanted in a targeted manner to form a piezoresistive pressure sensor element from it.

Figure 8:
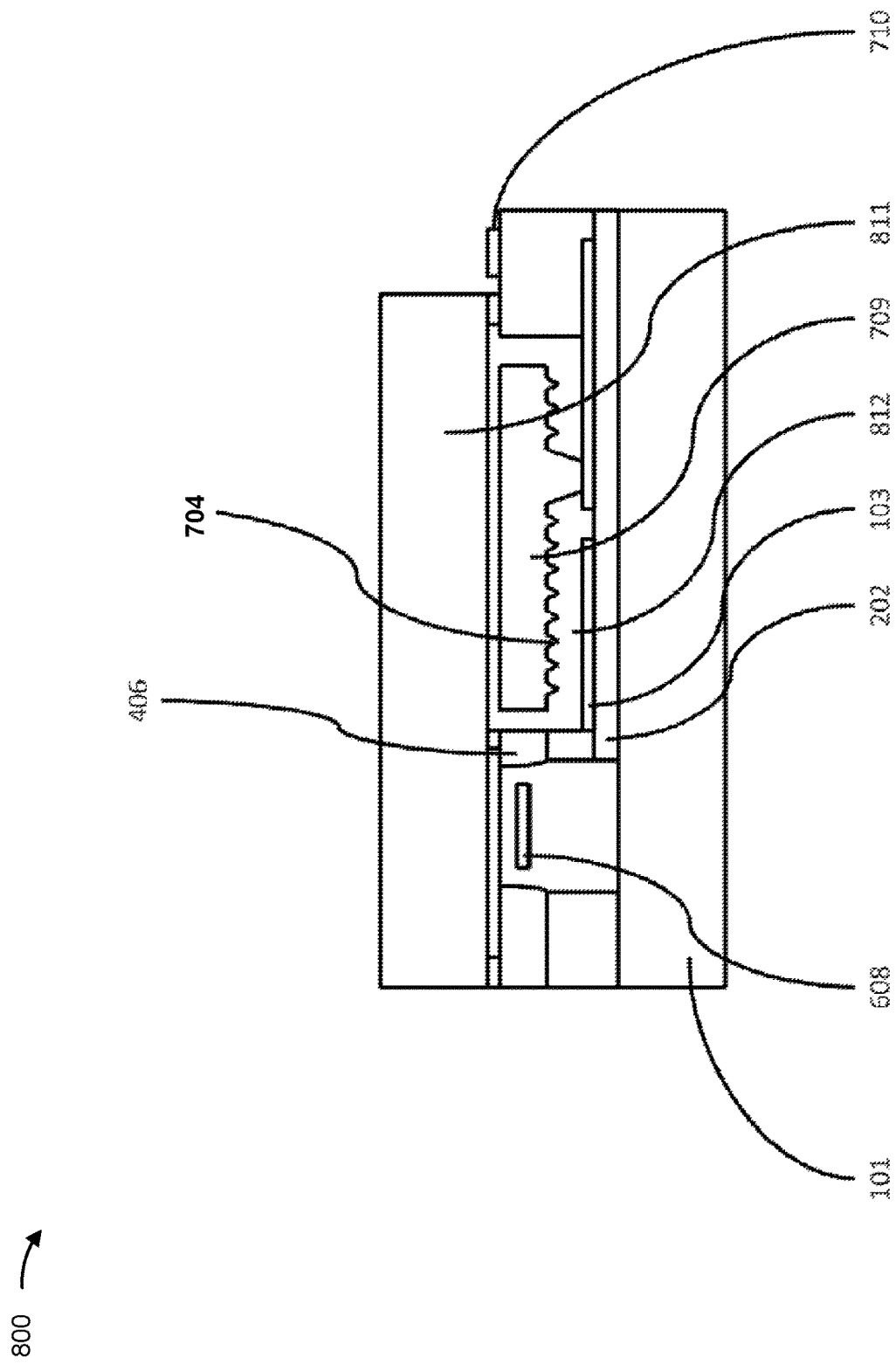
FIG. 8 shows the wafer from FIG. 7 after bonding.

Directly after the exposure of the acceleration mass 709 shown in FIG. 7, a cover wafer 811 can be bonded to the processed wafer 700. Thus, the wafer 800 shown in FIG. 8 is obtained, in which an acceleration sensor element cavity 812 is formed. The pressure within the acceleration sensor element cavity 812 corresponds to the pressure during bonding of the cover wafer 811 to the wafer 700. This pressure can be adjusted. In some implementations, the pressure within the acceleration sensor element cavity 812 can be more than 500 mbar. In some implementations, the pressure within the acceleration sensor element cavity 812 may be more than 900 mbar. The pressure within the acceleration sensor element cavity 812 can be sufficient to adequately dampen a motion of the acceleration sensor element mass 709.

Figure 9:
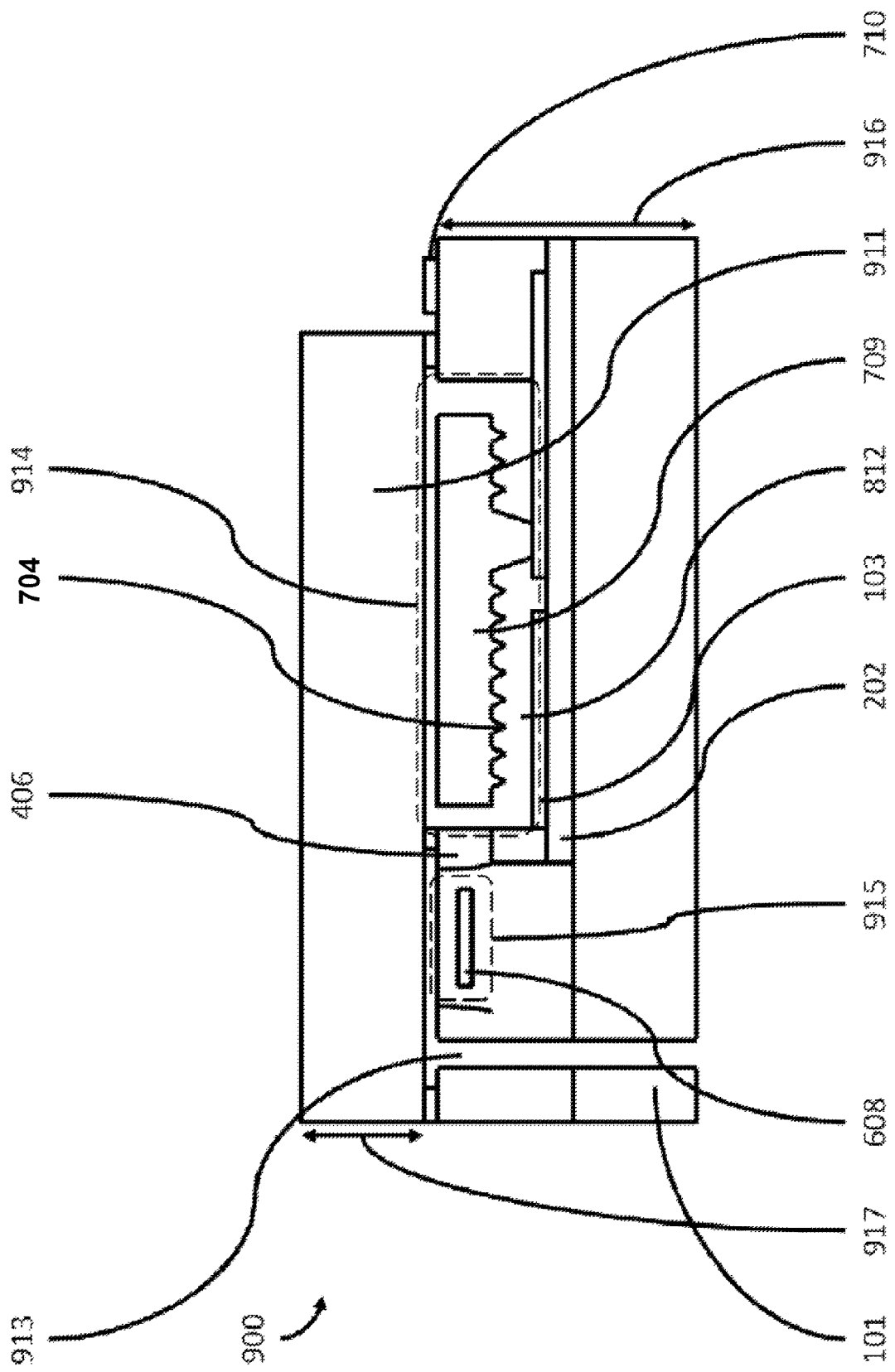
FIG. 9 shows the wafer from FIG. 8 after processing.

FIG. 9 shows a semiconductor die 900 which is obtained after dividing the wafer 800. The semiconductor die has a cover chip 911 (e.g., a portion of the cover wafer 811) and a semiconductor chip 916 (indicated by the double arrow line in FIG. 9). The height of the semiconductor chip 916 (also indicated by the double arrow line in FIG. 9) may be less than 500 μm. In some implementations, the height of the semiconductor chip 916 may be less than 350 μm. In some implementations, the thickness of the semiconductor chip is approximately 300 nm. The thickness 917 of the cover chip 911 may be less than 250 μm. In some implementations, the thickness 917 of the cover chip 911 may be less than 200 μm. In some implementations, the thickness 917 of the cover chip 911 can be approximately 150 μm, for example.

From the rear side of the semiconductor chip 916 a through opening 913 has been introduced to allow the surface of the membrane of the piezoresistive pressure sensor element 915 to be in contact with the ambient pressure.

The capacitive acceleration sensor element 914 can be configured to measure accelerations in a direction perpendicular to the direction of the substrate 101. In some implementations, the acceleration sensor element 914 may be designed in such a way that the acceleration sensor element 914 can measure accelerations by movement of an acceleration sensor element mass in a direction parallel to the surface of the substrate. In some implementations, the sensitivity of acceleration sensor elements 914 in the plane of the semiconductor chip can be approximately the same as the sensitivity of an acceleration sensor element 914 in a direction perpendicular thereto. In contrast to piezoresistive acceleration sensor elements, it is thus possible to provide a sensor that has an essentially equal sensitivity in all three spatial directions. In addition, a plurality of acceleration sensor elements 914 can be provided, which can measure accelerations not only in one direction, but also about an axis. Furthermore, the piezoresistive pressure sensor allows pressures to be determined even with small movements of the membrane. In some implementations, the covering of the pressure sensor element 915 with a gel can be dispensed with.

Figure 10:
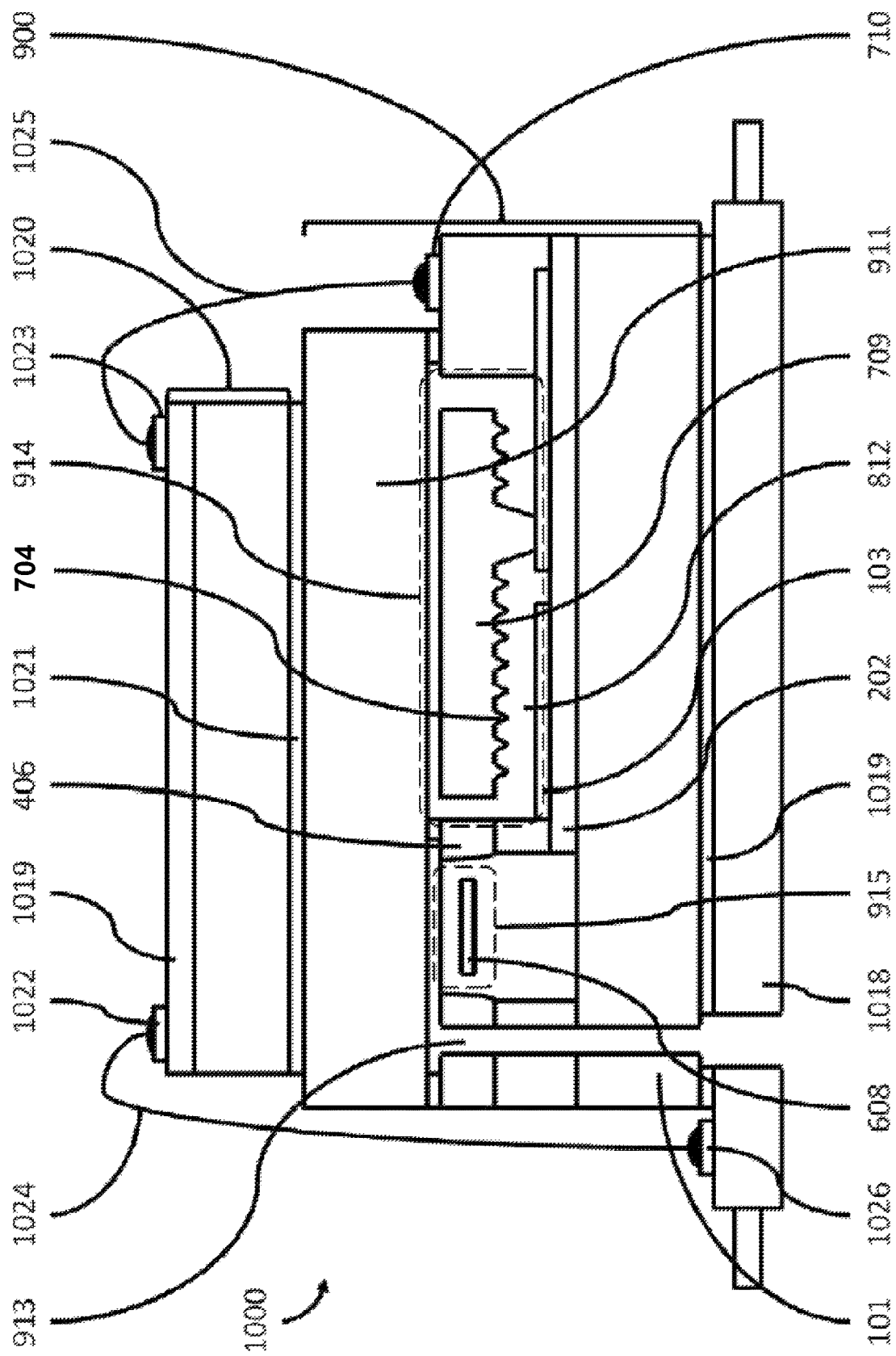
FIG. 10 shows a sensor.

FIG. 10 shows a sensor 1000 which comprises the semiconductor die 900. The semiconductor die 900 is connected to a lead frame 1018 by an adhesive 1019. A control chip 1020 is attached to the top of the semiconductor die 900 by an adhesive 1021. In some implementations, the control chip 1020 can comprise integrated semiconductor circuits that can be used to evaluate the signals of the piezoresistive pressure sensor element 915 and the capacitive acceleration sensor element 914. For this purpose, contacting pads 1022, 1023, 1026 are provided to produce electrical connections between the various chips using bonding wires 1024, 1025.

Figure 11:
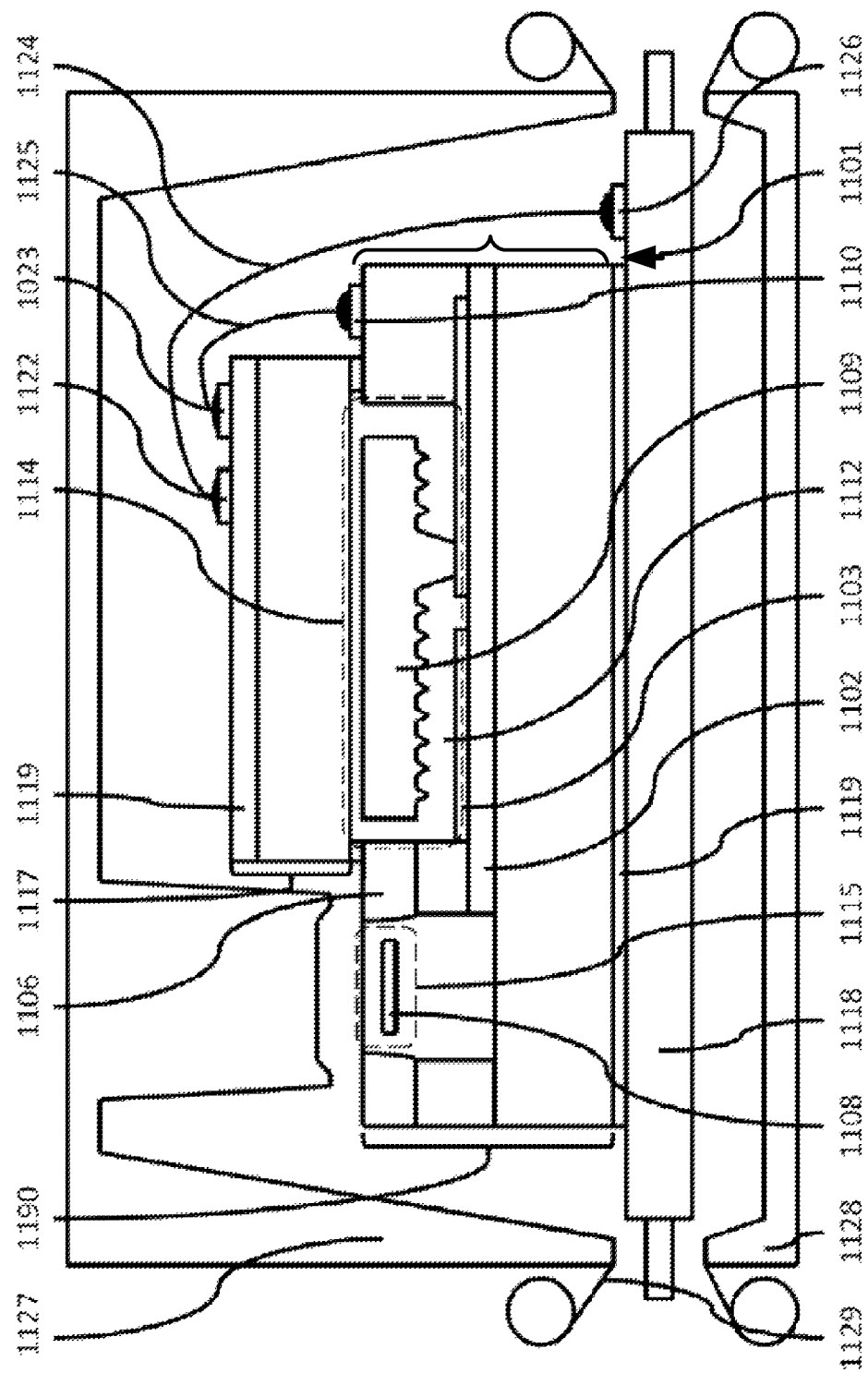
FIG. 11 shows a method for producing the sensor.

FIG. 11 shows another sensor shortly before completion of its manufacture. Like the sensor 1000, the sensor shown in FIG. 11 comprises a substrate 1101, an insulation layer 1102, a sensor surface 1103, a polycrystalline semiconductor material 1106, a buried cavity 1108, an acceleration sensor element mass 1109, a contacting pad 1110, an acceleration sensor element cavity 1112, a cover chip 1111, a capacitive acceleration sensor element 1114, a piezoresistive pressure sensor element 1115, a lead frame 1118, adhesive 1119, contact pads 1122, 1123, bonding wires 1124, 1125, a contacting pad 1126. In some implementations, no through opening 913 is introduced from the rear side of the semiconductor chip.

FIG. 11 also shows an upper mold half 1127 and a lower mold half 1128, between which the sensor is arranged. The foil 1129 provides a seal during the introduction of an encapsulation material into the closed mold.

Figure 12:
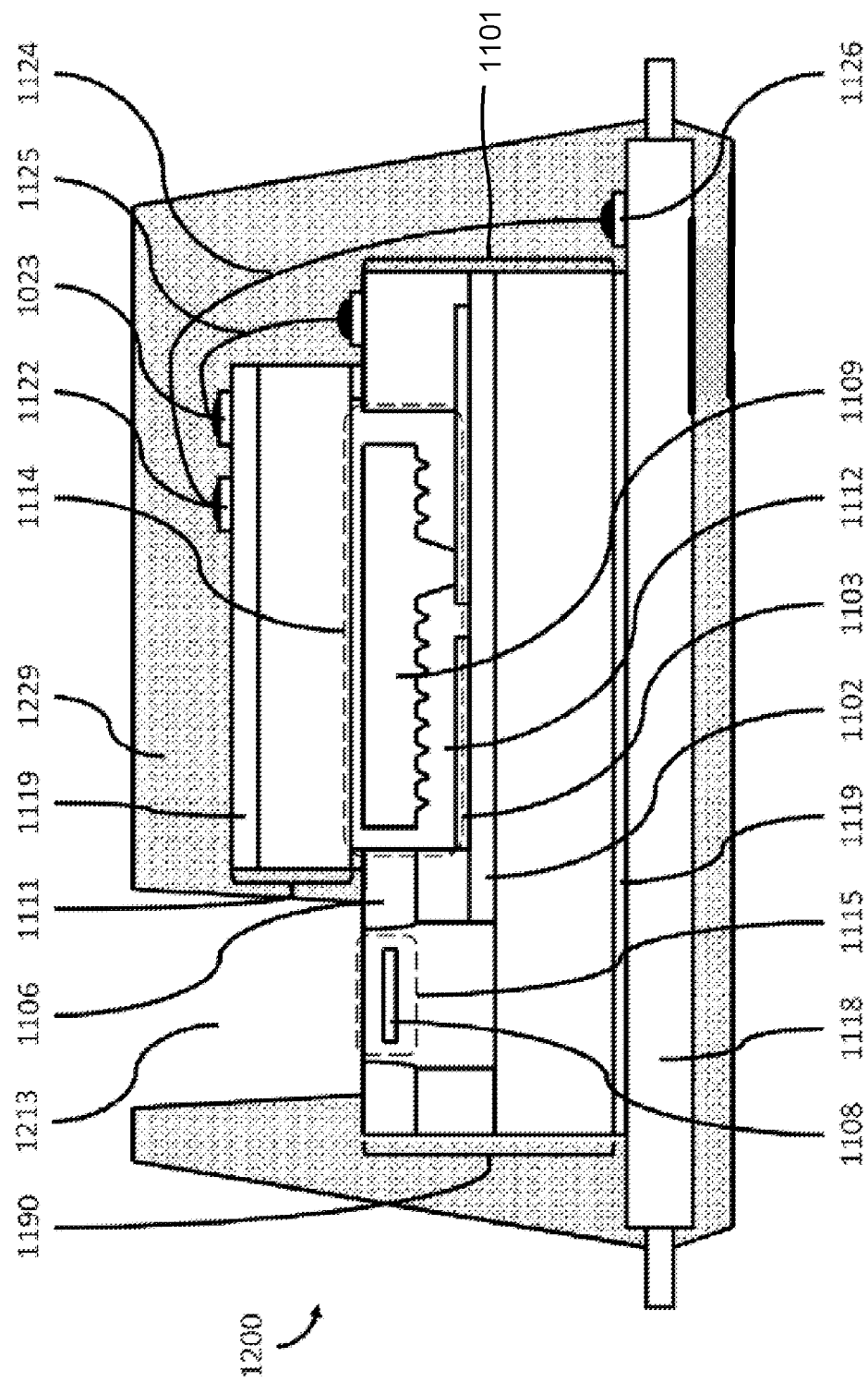
FIG. 12 shows a sensor.

FIG. 12 shows the sensor after the insertion and curing of the encapsulation material 1229. The upper mold half 1127 was configured such that the region above the pressure sensor element 1115 is not covered with the encapsulation material, so that a through opening 1213 has formed through which the membrane of the pressure sensor element 1115 can react to the ambient pressure.

The arrangement shown of a piezoresistive pressure sensor element 1115 and a capacitive acceleration sensor element 1114 side by side allows both elements to be produced in a common semiconductor deposition process while nevertheless benefiting from the respective advantages of the piezoresistive pressure sensor and the capacitive acceleration sensor. In addition, the parallel production reduces the production time for the sensors. Finally, the sensors and semiconductor dies proposed here can be produced using existing semiconductor processing facilities.

Examples

Some example implementations are defined by the following aspects:

Aspect 1. A semiconductor die, wherein the semiconductor die comprises a semiconductor chip, wherein the semiconductor chip comprises a piezoresistive pressure sensor element and at least one capacitive acceleration sensor element, wherein the piezoresistive pressure sensor element is arranged to the side of the capacitive acceleration sensor element.

Aspect 2. A semiconductor die, wherein the piezoresistive pressure sensor element comprises a buried cavity.

Aspect 3. A semiconductor die, wherein a gas pressure in the cavity is less than 15 mbar.

Aspect 4. A semiconductor die, wherein the piezoresistive pressure sensor element comprises a membrane made from a monocrystalline semiconductor material.

Aspect 5. A semiconductor die, wherein the acceleration sensor element is a multi-axial acceleration sensor element, in particular a tri-axial acceleration sensor element.

Aspect 6. A semiconductor die, wherein the acceleration sensor element comprises a movable acceleration mass which is made of a polycrystalline semiconductor material.

Aspect 7. A semiconductor die, wherein the semiconductor die comprises a cover chip, wherein the cover chip and the semiconductor chip are connected to each other by bonding.

Aspect 8. A semiconductor die, wherein an acceleration sensor element cavity is formed between the semiconductor die and the cover chip, in which the acceleration mass is arranged.

Aspect 9. A semiconductor die, wherein the cover chip comprises an integrated circuit.

Aspect 10. A method for producing a semiconductor die, in particular for producing a semiconductor die according to any one of aspects 1 through 9, wherein a semiconductor wafer with a monocrystalline cover layer is provided, wherein an insulation oxide layer is applied to the semiconductor wafer, wherein a section of the monocrystalline cover layer is exposed by structuring the insulation layer, wherein a semiconductor layer is produced by deposition of a semiconductor material, in particular silicon, wherein the semiconductor layer has a monocrystalline section and a polycrystalline section.

Aspect 11. The method according to aspect 10, wherein a buried cavity is generated in the monocrystalline section.

Aspect 12. The method according to aspect 10 or 11, wherein an acceleration mass is structured in the polycrystalline section.

Although specific example implementations have been illustrated and described in this description, persons with current knowledge of the art will recognize that a plurality of alternative and/or equivalent implementations can be chosen as a substitute for the specific example implementations shown and described in this description, without deviating from the scope of the implementation disclosed. It is the intention that this application covers all adaptations or variations of the specific example implementations discussed here. It is therefore intended that this disclosure is limited only by the claims and their equivalents.

What is claimed is:

1. A semiconductor die comprising:
   a semiconductor chip, wherein the semiconductor chip comprises:
      a semiconductor substrate having a monocrystalline cover layer;
      a monocrystalline section including a monocrystalline semiconductor layer extending from the monocrystalline cover layer;
      a polycrystalline section arranged on the monocrystalline cover layer, the monocrystalline section including an insulation layer arranged on the monocrystalline cover layer, and a polycrystalline semiconductor layer arranged on the insulation layer;
      a piezoresistive pressure sensor element formed by the monocrystalline semiconductor layer, wherein the piezoresistive pressure sensor element comprises a buried cavity that is buried within the monocrystalline semiconductor layer such that the buried cavity is completely surrounded by the monocrystalline semiconductor layer; and
      a plurality of capacitive acceleration sensor elements configured to measure an acceleration in three spatial directions and about an axis, each capacitive acceleration sensor element, of the plurality of capacitive acceleration sensor elements, comprising a respective movable acceleration mass formed by the polycrystalline semiconductor layer,
      wherein the respective movable acceleration mass of each capacitive acceleration sensor element, comprises a plurality of projections configured to prevent the respective movable acceleration mass from adhering to a sensor surface associated with the capacitive acceleration sensor element, and
      wherein the piezoresistive pressure sensor element is arranged to a side of the plurality of capacitive acceleration sensor elements.

2. The semiconductor die of claim 1, wherein the piezoresistive pressure sensor element comprises a membrane made from a monocrystalline semiconductor material.

3. The semiconductor die of claim 1, wherein at least one capacitive acceleration sensor element, of the plurality of capacitive acceleration sensor elements, is a multi-axial acceleration sensor element.

4. The semiconductor die of claim 1, further comprising:
   a cover chip,
      wherein the cover chip comprises an integrated circuit configured to receive and process electrical signals from the piezoresistive pressure sensor element and the capacitive acceleration sensor element, and
      wherein the cover chip is connected to the semiconductor chip by bonding.

5. The semiconductor die of claim 4, wherein the respective movable acceleration mass comprises a polycrystalline semiconductor material, and
   wherein an acceleration sensor element cavity is formed between the semiconductor die and the cover chip, in which the respective movable acceleration mass is arranged.

6. The semiconductor die of claim 1, wherein at least one capacitive acceleration sensor element, of the plurality of capacitive acceleration sensor elements, is a tri-axial acceleration sensor element.

7. The semiconductor die of claim 1, wherein at least one capacitive acceleration sensor element, of the plurality of capacitive acceleration sensor elements, has equal sensitivity in the three spatial directions.

8. The semiconductor die of claim 1, further comprising:
   a cover chip arranged on and bonded to the polycrystalline semiconductor layer of the semiconductor chip, the cover chip and the semiconductor substrate being arranged at opposite sides of the polycrystalline semiconductor layer,
      wherein the plurality of capacitive acceleration sensor elements are arranged in an enclosed acceleration sensor element cavity,
      wherein the semiconductor chip includes a recess that defines a portion of the enclosed acceleration sensor element cavity,
      wherein the recess extends from an upper surface of the polycrystalline semiconductor layer into the polycrystalline semiconductor layer,
      wherein the cover chip is arranged over the recess in order to enclose the recess and to form the enclosed acceleration sensor element cavity,
      wherein the cover chip is arranged on and bonded to the upper surface of the polycrystalline semiconductor layer,
      wherein the enclosed acceleration sensor element cavity is entirely confined within the polycrystalline section, and
      wherein the monocrystalline section and the polycrystalline section are laterally adjacent sections.

9. The semiconductor die of claim 8, wherein a gas pressure in the buried cavity is less than 15 mbar and a pressure in the enclosed acceleration sensor element cavity is greater than 500 mbar.

10. The semiconductor die of claim 8, wherein the cover chip comprises an integrated circuit configured to receive and process electrical signals from the piezoresistive pressure sensor element and the plurality of capacitive acceleration sensor elements.

11. The semiconductor die of claim 8, further comprising:
a control chip arranged on and bonded to the cover chip such that the cover chip is arranged between the semiconductor chip and the control chip, wherein the control chip comprises an integrated circuit configured to receive and process electrical signals from the piezoresistive pressure sensor element and the plurality of capacitive acceleration sensor elements.

12. The semiconductor die of claim 8, wherein the piezoresistive pressure sensor element, including a membrane of the piezoresistive pressure sensor element, is arranged entirely outside of the enclosed acceleration sensor element cavity, and
wherein the membrane and the cover chip are arranged at a same side of the semiconductor chip.

13. The semiconductor die of claim 8, wherein the enclosed acceleration sensor element cavity does not vertically overlap with the monocrystalline section.

14. The semiconductor die of claim 8, wherein the piezoresistive pressure sensor element comprises a membrane made from the monocrystalline semiconductor layer, and
wherein the membrane is co-planar with the upper surface of the polycrystalline semiconductor layer.

15. The semiconductor die of claim 1, wherein the sensor surface is arranged on the insulation layer, between the insulation layer and a respective movable acceleration mass.

16. A semiconductor chip comprising:
a semiconductor substrate having a monocrystalline cover layer;
a monocrystalline section including a monocrystalline semiconductor layer extending from the monocrystalline cover layer;
a polycrystalline section arranged on the monocrystalline cover layer, the monocrystalline section including an insulation layer arranged on the monocrystalline cover layer, and a polycrystalline semiconductor layer arranged on the insulation layer;
a piezoresistive pressure sensor element formed by the monocrystalline semiconductor layer, wherein the piezoresistive pressure sensor element comprises a buried cavity that is buried within the monocrystalline semiconductor layer such that the buried cavity is completely surrounded on all sides by the monocrystalline semiconductor layer; and
a plurality of capacitive acceleration sensor elements configured to measure an acceleration in three spatial directions and about an axis, each capacitive acceleration sensor, of the plurality of capacitive acceleration sensor elements, comprising a respective movable acceleration mass formed by the polycrystalline semiconductor layer,
wherein the respective movable acceleration mass of each capacitive acceleration sensor element comprises a plurality of projections configured to prevent the respective movable acceleration mass from adhering to a sensor surface associated with the capacitive acceleration sensor element,
wherein each sensor surface is arranged on the insulation layer, between the insulation layer and a respective movable acceleration mass, and
wherein the piezoresistive pressure sensor element is arranged to a side of the plurality of capacitive acceleration sensor elements.

17. The semiconductor chip of claim 16, wherein the piezoresistive pressure sensor element comprises a membrane made from a monocrystalline semiconductor material.

18. The semiconductor chip of claim 16, further comprising:
a cover chip,
wherein the cover chip comprises an integrated circuit configured to receive and process electrical signals from the piezoresistive pressure sensor element and the capacitive acceleration sensor element, and
wherein the cover chip is connected to the semiconductor chip by bonding.

19. The semiconductor chip of claim 18, wherein the respective movable acceleration mass comprises a polycrystalline semiconductor material,
wherein an acceleration sensor element cavity is formed between a semiconductor die and the cover chip, and
wherein the respective movable acceleration mass is arranged within the acceleration sensor element cavity.

20. The semiconductor chip of claim 16, wherein at least one capacitive acceleration sensor element, of the plurality of capacitive acceleration sensor elements, has equal sensitivity in the three spatial directions.

21. The semiconductor chip of claim 16, wherein the monocrystalline section and the polycrystalline section are laterally adjacent sections, and
wherein the plurality of capacitive acceleration sensor elements are arranged in an enclosed acceleration sensor element cavity that is entirely confined within the polycrystalline section such that the enclosed acceleration sensor element cavity does not vertically overlap with the monocrystalline section.

22. The semiconductor chip of claim 16, wherein the piezoresistive pressure sensor element comprises a membrane made from the monocrystalline semiconductor layer,
wherein the membrane is co-planar with an upper surface of the polycrystalline semiconductor layer, and
wherein the upper surface faces away from the sensor surface.

* * * * *